United States Patent
Nam et al.

(10) Patent No.: US 10,498,227 B2
(45) Date of Patent: Dec. 3, 2019

(54) POWER CONVERSION APPARATUS AND AIR CONDITIONER INCLUDING THE SAME

(71) Applicant: LG ELECTRONICS INC., Seoul (KR)

(72) Inventors: Hansung Nam, Seoul (KR); Wonwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 13 days.

(21) Appl. No.: 15/876,338

(22) Filed: Jan. 22, 2018

(65) Prior Publication Data

US 2018/0309360 A1    Oct. 25, 2018

(30) Foreign Application Priority Data

Apr. 24, 2017    (KR) ................. 10-2017-0052476

(51) Int. Cl.
| | |
|---|---|
| *H02M 1/44* | (2007.01) |
| *H02M 7/48* | (2007.01) |
| *H03H 7/09* | (2006.01) |
| *H03K 17/16* | (2006.01) |
| *H02P 9/44* | (2006.01) |
| *H02P 21/22* | (2016.01) |
| *F25B 49/02* | (2006.01) |

(52) U.S. Cl.
CPC ............ *H02M 1/44* (2013.01); *F25B 49/02* (2013.01); *H02M 7/48* (2013.01); *H02P 9/44* (2013.01); *H02P 21/22* (2016.02); *H03H 7/09* (2013.01); *H03K 17/161* (2013.01)

(58) Field of Classification Search
CPC ........ H02K 27/04; H02K 27/12; H02K 27/16; H02K 27/20; B60L 9/26
USPC ......................................... 318/244
See application file for complete search history.

(56) References Cited

U.S. PATENT DOCUMENTS

| | | | | |
|---|---|---|---|---|
| 5,694,065 | A | * 12/1997 | Hamasaki | ........ H03K 19/00361 326/83 |
| 2001/0045864 | A1 | * 11/2001 | Kimppa | ................. H03H 11/12 327/553 |
| 2007/0216340 | A1 | * 9/2007 | Iura | ........................... H02P 3/18 318/801 |

(Continued)

FOREIGN PATENT DOCUMENTS

| | | |
|---|---|---|
| JP | 2004-023880 | 1/2004 |
| JP | 2005-051959 | 2/2005 |

(Continued)

OTHER PUBLICATIONS

European Search Report dated Aug. 21, 2018 issued in Application No. 18151815.0.

*Primary Examiner* — Kawing Chan
*Assistant Examiner* — Bradley R Brown
(74) *Attorney, Agent, or Firm* — KED & Associates, LLP

(57) ABSTRACT

A power conversion apparatus capable of improving an EMI characteristic and an air conditioner including the same are disclosed. The power conversion apparatus includes an inverter including a plurality of switching elements corresponding to three phases, a gate driver configured to drive the switching elements of the inverter, and a noise reducer connected to the gate driver and configured to set switching noise occurrence times caused by the switching elements in the respective phases to be different.

20 Claims, 8 Drawing Sheets

(56) References Cited

U.S. PATENT DOCUMENTS

| | | | |
|---|---|---|---|
| 2007/0273350 A1 | 11/2007 | Yamamoto | |
| 2009/0140680 A1* | 6/2009 | Park | H02P 23/26 |
| | | | 318/438 |
| 2013/0039100 A1* | 2/2013 | Kazama | H03K 17/164 |
| | | | 363/41 |
| 2015/0171770 A1 | 6/2015 | Wagoner et al. | |

FOREIGN PATENT DOCUMENTS

| | | | |
|---|---|---|---|
| JP | 2008-236889 | | 10/2008 |
| JP | 2014-036539 | | 2/2014 |
| JP | 2014036539 A | * | 2/2014 |
| KR | 10-2012-0086121 | | 8/2012 |
| WO | WO 2013/159281 | | 10/2013 |

* cited by examiner

POWER CONVERSION APPARATUS AND AIR CONDITIONER INCLUDING THE SAME

CROSS-REFERENCE TO RELATED APPLICATION(S)

This application claims priority under 35 U.S.C. § 119 to Korean Application No. 10-2017-0052476, filed on Apr. 24, 2017, whose entire disclosure is hereby incorporated by reference.

BACKGROUND

1. Field

The present disclosure relates to a power conversion apparatus having improved electromagnetic interference (EMI) characteristics, and an air conditioner including the same.

2. Background

A compressor of an air conditioner may be driven by a motor. Alternating current (AC) power may be supplied to the motor from a power conversion apparatus (or power converter). The power conversion apparatus may include a rectifier, a power factor controller, and an inverter.

A commercial AC voltage output from a commercial power source may be rectified or otherwise modified by the rectifier, such as to form direct current (DC) power. The voltage rectified by the rectifier may be supplied to the inverter. The inverter may generate AC power to drive the motor using the voltage outputted by the rectifier.

In some power conversion apparatus, a DC-DC converter (also referred to as a DC-to-DC converter) to change, regulate, or otherwise improve a power factor may be provided between the rectifier and the inverter. A collector current, which is a current applied to a switching element, may be raised with a predetermined slope by an inductor component of the motor but may include noise before the switching element is fully switched on. Such noise may be caused by switching noise of the switching element. In this situation, switching noise occurring in each phase may overlap and may be amplified.

This switching noise may deteriorate an electromagnetic interference (EMI) characteristic. While the deterioration of the EMI characteristic may be at least partially addressed by changing a switching frequency or by modifying the circuit configuration of the power conversion apparatus, increased complexity and/or increased costs may arise. Accordingly, improving the EMI characteristic by without changing a switching frequency may be desirable.

BRIEF DESCRIPTION OF THE DRAWINGS

The embodiments will be described in detail with reference to the following drawings in which like reference numerals refer to like elements, and wherein.

DETAILED DESCRIPTION

Figure 1:
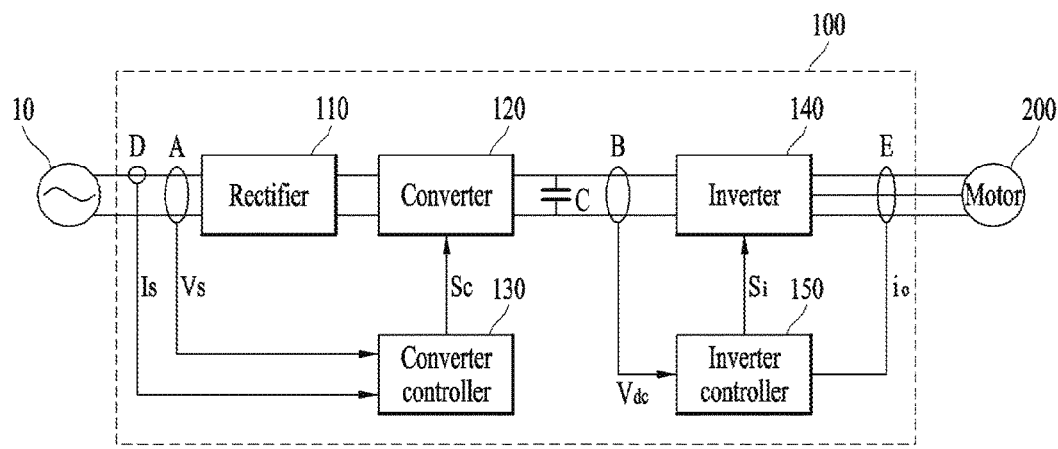
FIG. 1 is a block diagram of a power conversion apparatus according to an embodiment of the present disclosure.
Figure 2:
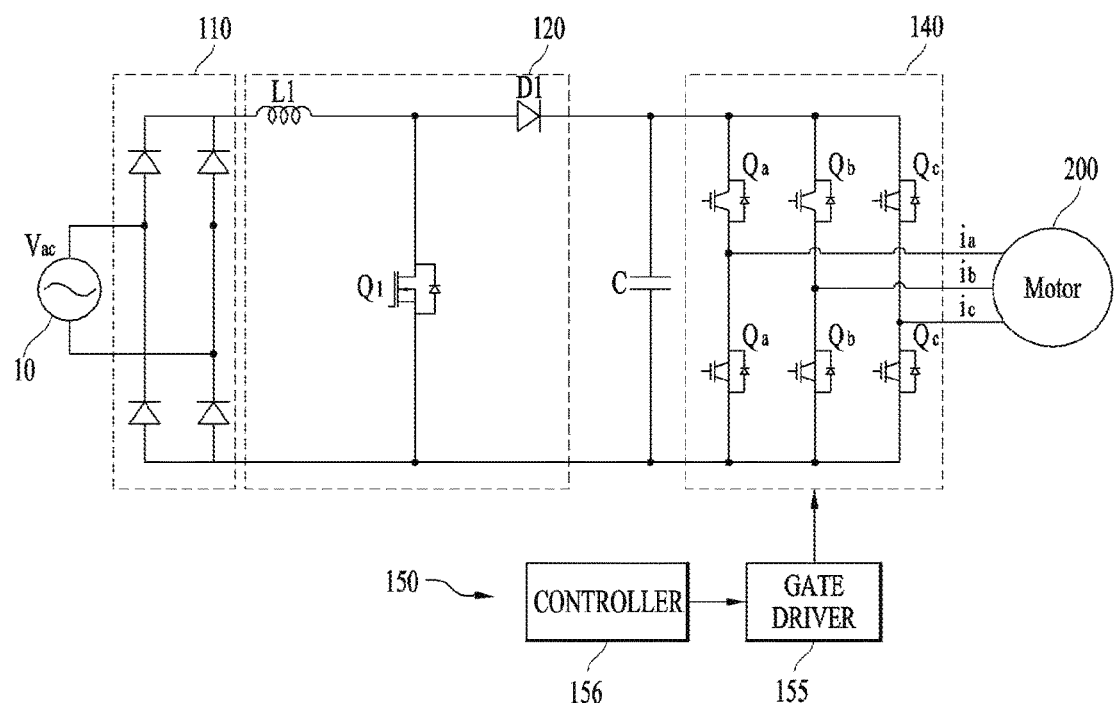
FIG. 2 is a circuit diagram of the power conversion apparatus according to an embodiment of the present disclosure.

FIG. 1 is a block diagram of a power conversion apparatus 100 (also referred to as a converter or a power conversion circuit), and FIG. 2 is a circuit diagram of the power conversion apparatus 100 according to an embodiment of the present disclosure. Referring to FIGS. 1 and 2, the power conversion apparatus 100 may include a rectifier 110 that rectifies a voltage input from an alternating current (AC) power supply 10, a converter 120 that boosts or bucks a direct current (DC) voltage rectified by the rectifier 110 or controls a power factor of the DC voltage, a converter controller 130 that controls the converter 120, an inverter 140 that outputs a three-phase AC current, an inverter controller 150 that controls the inverter 140, and a DC-link capacitor C connected between the converter 120 and the inverter 140. The motor driving apparatus 100 may further include a DC terminal voltage detector B, an input voltage detector A, an input current detector D, and an output current detector E.

The inverter 140 may output the three-phase AC current to drive a motor 200. Herein, the motor 200 may be a compressor motor that drives a compressor of an air conditioner. Hereinafter, the motor 200 is described as being a compressor motor for driving the air conditioner, and the power conversion apparatus 100 is described as a motor driving apparatus for driving the compressor motor. However, the motor 200 is not limited to being compressor motor and may include other types of an AC motor used in various applications using a frequency-variable AC voltage, such as a motor for a refrigerator, a washing machine, an electric car, an automobile, a cleaner, etc.

In general, the motor driving apparatus 100 may receive power from various sources, such as the AC power supply 10, convert the power for use by the motor 200, and supply the converted power to the motor 200. In another example, motor driving apparatus 100 may be coupled to a DC power source, such as a battery, and may convert the DC power to drive the motor 200.

The converter 120 may convert power input from the AC power supply 10 into DC power. For example, the converter 120 may use a DC-DC converter operating as a power factor control (PFC) unit. The DC-DC converter may use a boost converter. In different configurations, the converter 120 may be used in circuits that include or exclude the rectifier 110. Hereinafter, the converter 120 is described as correspond to or include the boost converter, but it should be appreciated that converter 120 may correspond to additional or different types of converting circuitry.

The rectifier 110 may rectify power input from the AC power supply 10 and may output the rectified power to the converter 120. To rectify the received AC power, the rectifier 110 may use or include a full-wave rectification circuit using bridge diodes. In this way, when boosting and smoothing a voltage signal rectified by the rectifier 110, the converter 120 may perform an operation to amplify or otherwise improve a power factor.

As shown in FIG. 2, the converter 120 may include an inductor L1 connected to the rectifier 110, a switching element Q1 connected to the inductor L1, and a diode D1 connected between the switching element Q1 and the DC-link capacitor C. The boost converter 120 may generate an output voltage that is higher than an input voltage. If the switching element Q1 is turned on, the diode D1 may be turned off, and energy may be stored in the inductor L1. In addition, electric charges stored in the DC-link the capacitor C may be discharged to generate an output voltage at an output terminal.

If the switching element Q1 is turned off, energy which has been stored in the inductor L1 while the switching element Q1 is turned on may be added and then transmitted to the output terminal. Herein, the switching element Q1 may perform a switching operation by a pulse width modulation (PWM) signal. That is, a PWM signal transmitted by the converter controller 130 may be connected to a gate (or base) of the switching element Q1 so that the switching element Q1 may perform a switching operation based on receiving by this PWM signal. The converter controller 130 may include a gate driver that transmits the PWM signal to the gate of the switching element Q1 and a controller that transmits a driving signal to the gate driver.

The switching element Q1 may use a power transistor, such as an insulated-gate bipolar transistor (IGBT). The IGBT is a switching element having structures of a power metal oxide semiconductor field effect transistor (MOSFET) and a bipolar transistor and may achieve small driving power, high-speed switching, a high breakdown voltage, and high current density.

Thus, the converter controller 130 may control a turn-on time (or On time) of the switching element Q1 in the converter 120. For example, the converter controller 130 may output a converter control signal Sc that controls the turn-on time of the switching element Q1. To this end, the converter controller 130 may receive an input voltage Vs and an input current Is from the input voltage detector A and the input current detector D, respectively.

In some cases, one or more of the converter 120 or the converter controller 130 may be omitted. That For example, an output voltage passing through the rectifier 110 may be charged in the DC-link capacitor C or may drive the inverter 140, without passing through the converter 120.

The input voltage detector A may detect the input voltage Vs from the input AC power supply 10. For example, the input voltage detector A may be located in front of the rectifier 110. To detect the input voltage Vs, the input voltage detector A may include, for example, a resistor, an operational amplifier (OP AMP), and other related components. The detected input voltage Vs, which is a discrete signal of a pulse form, may be applied to the converter controller 130 in order to generate the converter control signal Sc.

Next, the input current detector D may detect the input current Is from the input AC power supply 10. Specifically, the input current detector D may be located in front of the rectifier 110 (e.g., between the AC power source 10 and the rectifier 110). To detect the input current Is, the input current detector D may include a current sensor, a current transformer (CT), a shunt resistor, and other related components. The detected input voltage Is, which is a discrete signal of a pulse form, may be applied to the converter controller 130 in order to generate the converter control signal Sc.

The DC voltage detector B positioned at an input of the inverter 140 may detect a DC voltage Vdc having a ripple component of the DC-link capacitor C. To detect the ripple voltage Vdc, the DC voltage detector B may include a resistor, an OP AMP, and other related components. The detected voltage Vdc of the DC-link capacitor C, which is a discrete signal of a pulse type, may be applied to the inverter controller 150. The inverter controller 150 may generate an inverter control signal Si based on the DC voltage Vdc of the DC-link capacitor C. Additionally or alternatively, the detected DC voltage from the DC voltage detector B may be provided to the converter controller 130 so as to be used to generate the converter control signal Sc.

As shown in FIG. 2, the inverter 140 includes a plurality of inverter switching elements Qa, Qb, Qc, Qa', Qb', and Qc'. The inverter 140 may convert a DC power voltage Vdc, which is smoothed by an on/off operation of the switching element Q1 of the converter 120, into a three-phase AC power voltage of a predetermined frequency and may output the three-phase AC power voltage to the three-phase motor 200.

Specifically, the inverter 140 may include serially connected pairs of upper and lower switching elements Qa and Qa', Qb and Qb', and Qc and Qc', and the total of three pairs of the upper and lower switching elements may be connected in parallel. Similar to the converter 120, each of the switching elements Qa, Qb, Qc, Qa', Qb', and Qc' of the inverter 140 may use one or more power transistors, such as IGBTs.

To control a switching operation of the inverter 140, the inverter controller 150 may output the inverter control signal Si to the inverter 140. The inverter control signal Si may be a switching control signal of a PWM scheme and may be generated based on an output current io flowing into the motor 200 and the DC-link voltage Vdc of both terminals of the DC-link capacitor C. The inverter controller 150 may include a gate driver 155 that transmits a PWM signal to gates of the switching elements Qa, Qb, Qc, Qa', Qb', and Qc' of the inverter 140 and a controller 156 that transmits a driving signal to the gate driver 155.

As shown in FIG. 1, the output current io may be detected by the output current detector E, and the DC-link voltage Vdc may be detected by the DC-link voltage detector B. The output current detector E may detect the output current io flowing between the inverter 140 and the motor 200. That is, the output current detector E may detect current flowing into the motor 200. In another example, the output current detector E may detect all output currents ia, ib, and is of all phases or may detect output currents of two phases using three-phase equilibrium. The output current detector E may be located between the inverter 140 and the motor 200 and may use a CT, a shunt resistor, etc. to detect current.

Figure 3:
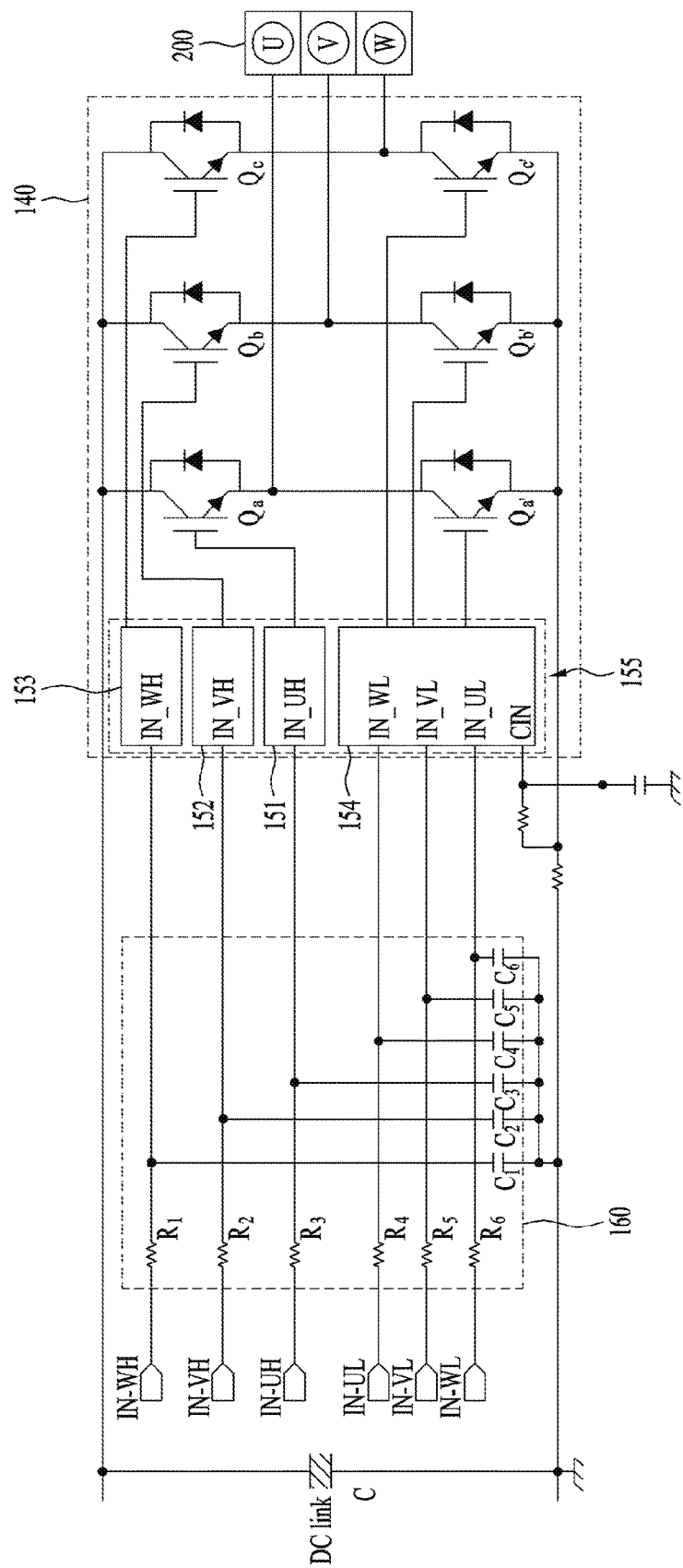
FIG. 3 is a circuit diagram illustrating the power conversion apparatus according to an embodiment of the present disclosure in detail.

FIG. 3 is a circuit diagram illustrating the power conversion apparatus 100 according to an embodiment of the present disclosure in detail. Referring to FIG. 3, an enlarged configuration between the DC-link capacitor C and the inverter 140 in the power conversion apparatus is mainly illustrated. That is, the power conversion apparatus 100 of FIG. 3 may include the inverter 140 with the plurality of switching elements Qa, Qb, Qc, Qa', Qb', and Qc' corresponding to three phases, the gate driver 155 for driving the switching elements Qa, Qb, Qc, Qa', Qb', and Qc' of the inverter 140, and a noise reducer (or noise reducing circuit) 160 connected to the gate driver 155, for setting switching noise occurrence times caused by the switching elements Qa, Qb, Qc, Qa', Qb', and Qc' in corresponding phases to be different.

In the example shown in FIG. 3, the gate driver 155 may include a first driver 151 for driving the switching element Qa of a U-phase upper arm IN_UH, a second driver 152 for driving the switching element Qb of a V-phase upper arm IN_VH, a third driver 153 for driving the switching element Qc of a W-phase upper arm IN_WH, and a fourth driver 154 for driving the switching elements Qa', Qb', and Qc' of U-phase, V-phase, and W-phase lower arms IN_UL, IN_VL, and IN_WL.

The gate driver 155 including the first driver 151, the second driver 152, the third driver 153, and the fourth driver 154 may be connected to the controller 156 (refer to FIG. 2) through the noise reducer 160. As illustrated in FIG. 3, the noise reducer 160 may include a plurality of resistor-capacitor (RC) filters R1/C1, R2/C2, R3/C3, R4/C4, R5/C5, and R6/C6, each of which is connected to a corresponding phase. At least two RC filters among the plurality of RC filters R1/C1, R2/C2, R3/C3, R4/C4, R5/C5, and R6/C6 may have different time constant values. The noise reducer 160 causes at least two of the switching elements Qa, Qb, Qc, Qa', Qb', and Qc' to generate different on/off times. Accordingly, overlapping of damping voltages is dispersed due to the different on/off time and electromagnetic interference (EMI) may be reduced. This effect will be described later in detail.

The noise reducer 160 may be located in front of the gate driver 155 (e.g., between the controller 156 and the gate driver 155) and may include a filter circuit. For example, the noise reducer 160 may be implemented using a resistance-capacitor (RC) filter circuit to eliminate noise. In one example of an RC filter circuit shown in FIG. 3, resistors R1, R2, R3, R4, R5, and R6 and capacitors C1, C2, C3, C4, C5, and C6 may be connected to respective terminals of three phases to prevent the switching elements Qa, Qb, Qc, Qa', Qb', and Qc' from operating by noise rather than a PWM signal.

Terminals IN_WH, IN_VH, IN_UH, IN_UL, IN_VL, and IN_WL to which signals from the controller 156 are input may be located at an input side of the noise reducer 160 implemented using the RC filter circuit. That is, the control signal input from the controller 156 may be transmitted to the gate driver 155 after passing through the noise reducer 160.

In some cases, the RC filters R1/C1, R2/C2, and R3/C3 connected to the upper switching elements Qa, Qb, and Qc of the respective phases and the RC filters R4/C4, R5/C5, and R6/C6 connected to the lower switching elements Qa', Qb', and Qc' of the respective phases may be treated separately. That is, the noise reducer 160 may set switching noise occurrence times, caused by the upper switching elements Qa, Qb, and Qc of the respective phases, to be different.

Meanwhile, the RC filters R1/C1, R2/C2, and R3/C3 connected to the upper switching elements Qa, Qb, and Qc of the respective phases and the RC filters R4/C4, R5/C5, and R6/C6 connected to the lower switching elements Qa', Qb', and Qc' of the respective phases may have one or more common values. That is, the RC filters connected to each phase may have a same time constant value. For example, the RC filters R1/C1 and R4/C4 connected to a U phase may have a similar first time constant value. Similarly, RC filters R2/C2 and R5/C5 connected to a V phase may have the similar second time constant value, and the RC filters R3/C3 and R6/C6 connected to a W phase may have a similar third time constant. Alternatively, switching noise occurrence times caused by the lower switching elements Qa', Qb', and Qc' of the respective phases may be set to be different.

Switching noise of the switching elements Qa, Qb, Qc, Qa', Qb', and Qc' may be generated in the process when the switching elements Qa, Qb, Qc, Qa', Qb', and Qc' are switched on/off. In this way, the noise reducer 160 may set on/off times of the switching elements Qa, Qb, Qc, Qa', Qb', and Qc' to be different. That is, the switching noise occurrence times may be equal to or overlap with respective on/off operation times of the switching elements.

As an example, all of the RC filters R1/C1, R2/C2, R3/C3, R4/C4, R5/C5, and R6/C6, each of which is connected to a corresponding phase, may have different time constant values. As another example, all of the RC filters R1/C1, R2/C2, and R3/C3 connected to the upper switching elements Qa, Qb, and Qc of the respective phases may have different time constant values. Alternatively, all of the RC filters R4/C4, R5/C5, and R6/C6 connected to the lower switching elements Qa', Qb', and Qc' of the respective phases may have different time constant values. As described above, the RC filters R1/C1, R2/C2, R3/C3 connected to the upper switching elements Qa, Qb, and Qc and the RC filters R4/C4, R5/C5, and R6/C6 connected to the lower switching elements Qa', Qb', and Qc' may be treated separately.

Hereinafter, three phases for generating three-phase AC signals will be referred to as a U phase, a V phase, and a W phase. In the case of the inverter, the noise reducer 160 can be described in relation to an RC filter and a switching element of each of the phases (U phase, V phase, and W phase). A description of the noise reducer 160 for each phase may be separately applied to the upper switching elements Qa, Qb, and Qc and the lower switching elements Qa', Qb', and Qc' or may be applied to either the upper switching elements Qa, Qb, and Qc or the lower switching elements Qa', Qb', and Qc'.

Time constant values of the plurality of RC filters R1/C1, R2/C2, R3/C3, R4/C4, R5/C5, and R6/C6 constituting the noise reducer 160 may be sequentially changed. In addition, the time constant values may be sequentially increased from a reference value. Herein, the reference value may be a switching start time for normal PWM driving of the switching elements Qa, Qb, Qc, Qa', Qb', and Qc'.

The noise reducer 160 of the above-described configuration may set switching noise occurrence times of the switching elements Qa, Qb, Qc, Qa', Qb', and Qc' to be sequentially delayed in each phase. In this configuration, the delayed time may be shorter than each of switching times of the switching elements Qa, Qb, Qc, Qa', Qb', and Qc'.

Figure 4:
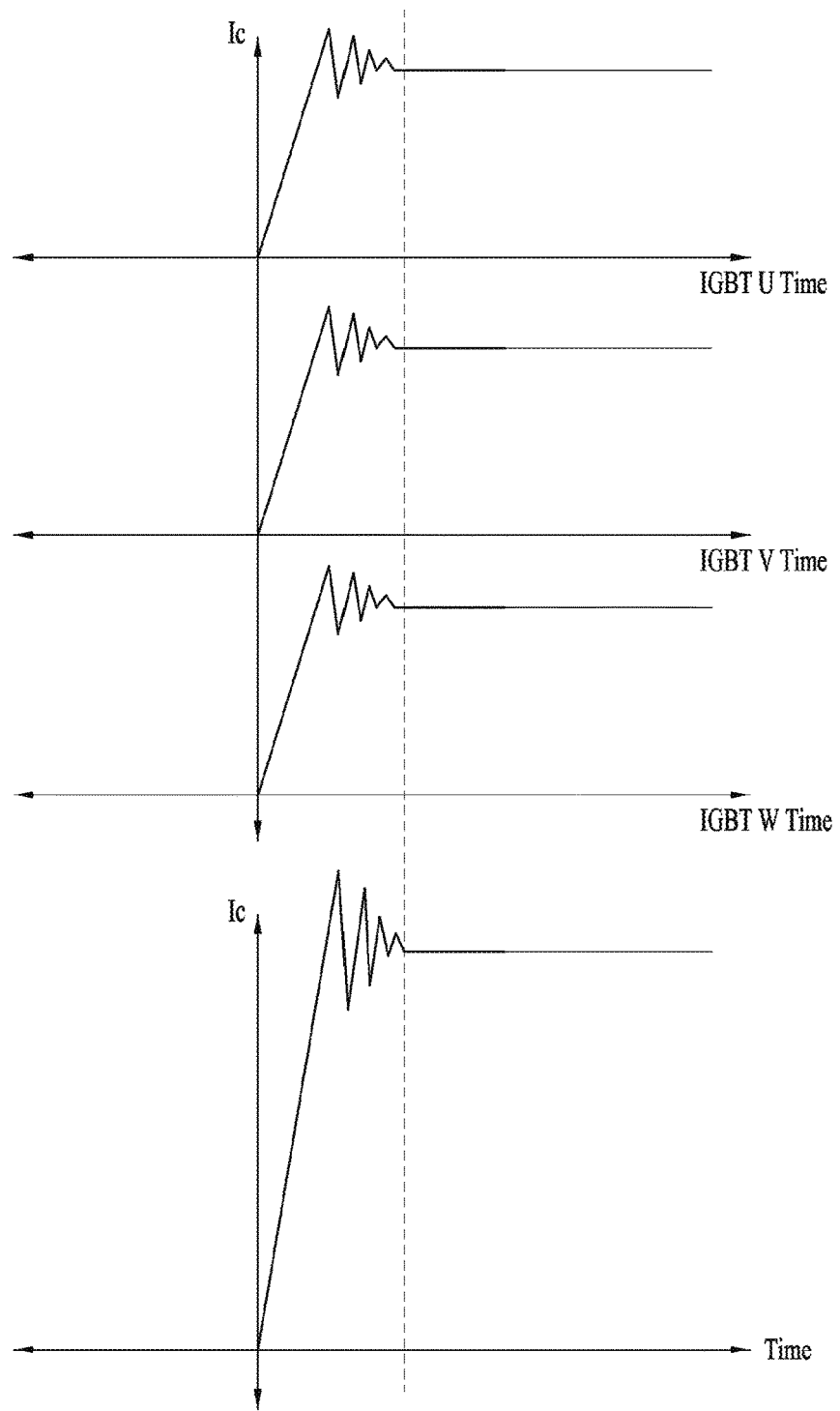
FIG. 4 is a waveform chart illustrating current when a normal filter circuit is applied.
Figure 5:
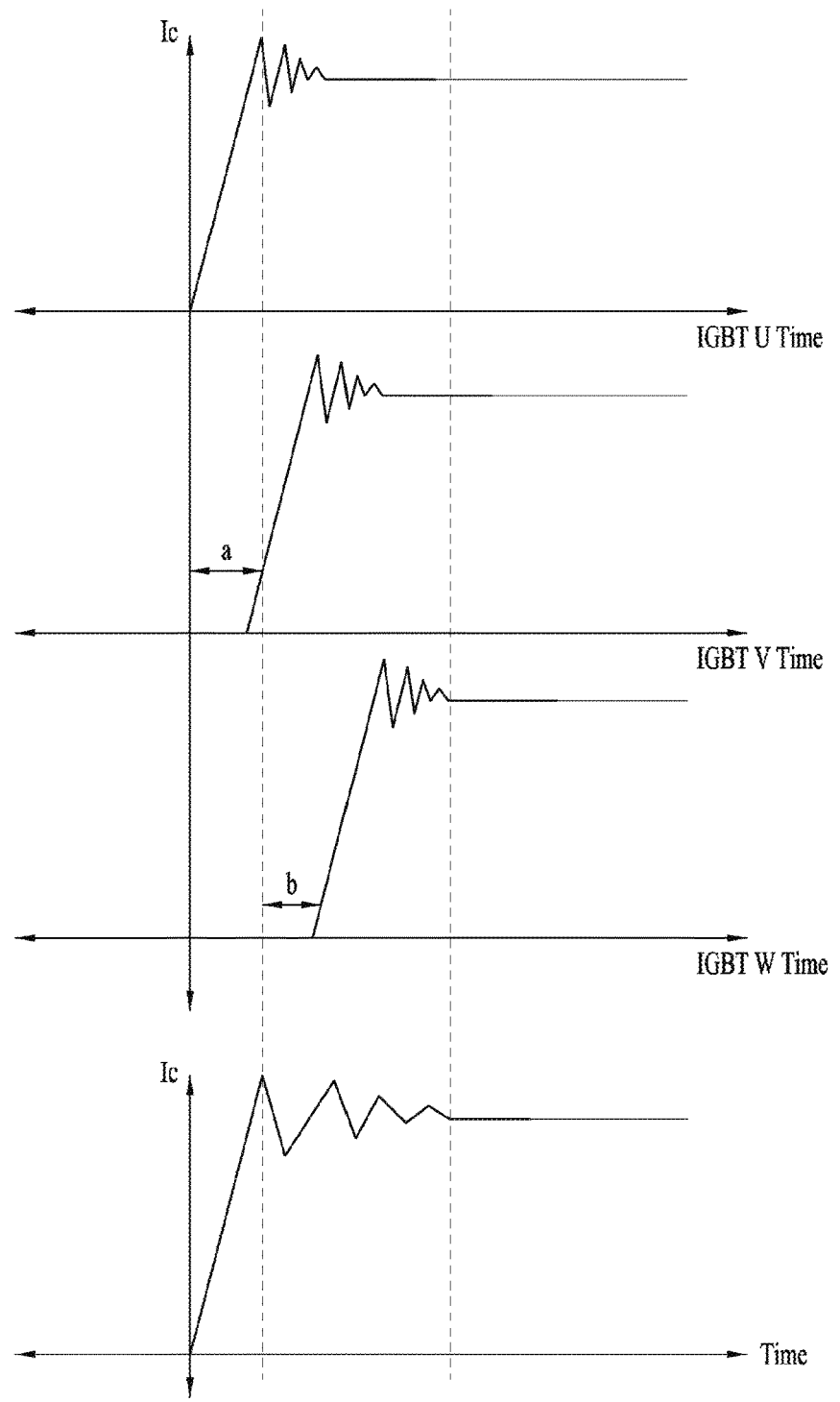
FIG. 5 is a waveform chart illustrating current when a noise reducer of the present disclosure is applied.

FIG. 4 is a waveform chart illustrating current when a normal filter circuit is applied, and FIG. 5 is a waveform chart illustrating current when a noise reducer of the present disclosure is applied. Referring to FIG. 4, a collector current Ic, which is a current applied to a switching element, may be raised with a predetermined slope by an inductor component of the motor 200 but may include noise before the switching element is fully switched on. Such noise may be caused by switching noise of the switching element. In this case, all of the switching noise components occurring in respective phases overlap, as illustrated in a signal of the lowermost waveform in FIG. 4. Thus, the noise components overlap, and a noise peak appears. The noise peak may deteriorate an EMI characteristic.

However, as illustrated in FIG. 5 according to an embodiment of the present disclosure, a switching time on each phase is delayed by time periods a and b. For example, switching of a switching element on a U phase may be performed based on a reference switching time, but the switching may be delayed in a switching element on a V phase by a predetermined delay time a. In addition, switching of the switching element on a W phase may be delayed by a predetermined delay time b after delay time a. Herein, the delay time a on the V phase and the delay time b on the W phase may be equal or may be different.

Thus, on/off times of switching elements differ. Referring to the lowermost waveform of FIG. 5, noise components of respective phases are dispersed and EMI is reduced. That is, overlapping of noise may be avoided due to the delays of time periods a and b in the switching of the V-phase and the W-phase, and a noise peak does not appear due to the switching delays in the V-phase and the W-phase. Therefore, an EMI characteristic can be improved since the noise peak is not formed. It should be appreciated that while FIG. 5 shows switching delays in the V-phase and the W-phase of, respectively, the a and b time periods after the switching of the U phase, different delays may be applied such that the switching of the U, V, and W phases are staggered. For example, switching in the U-phase and the V-phase may be delayed by, respectively, the a and b time periods after the W phase.

Figure 6:
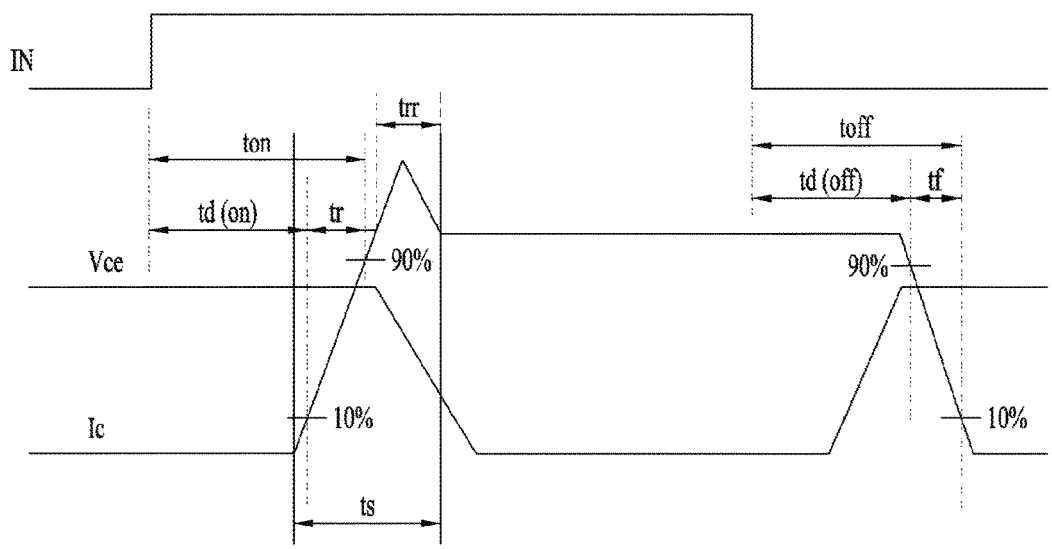
FIG. 6 is a waveform chart illustrating current and voltage waveforms of a switching element.
Figure 7:
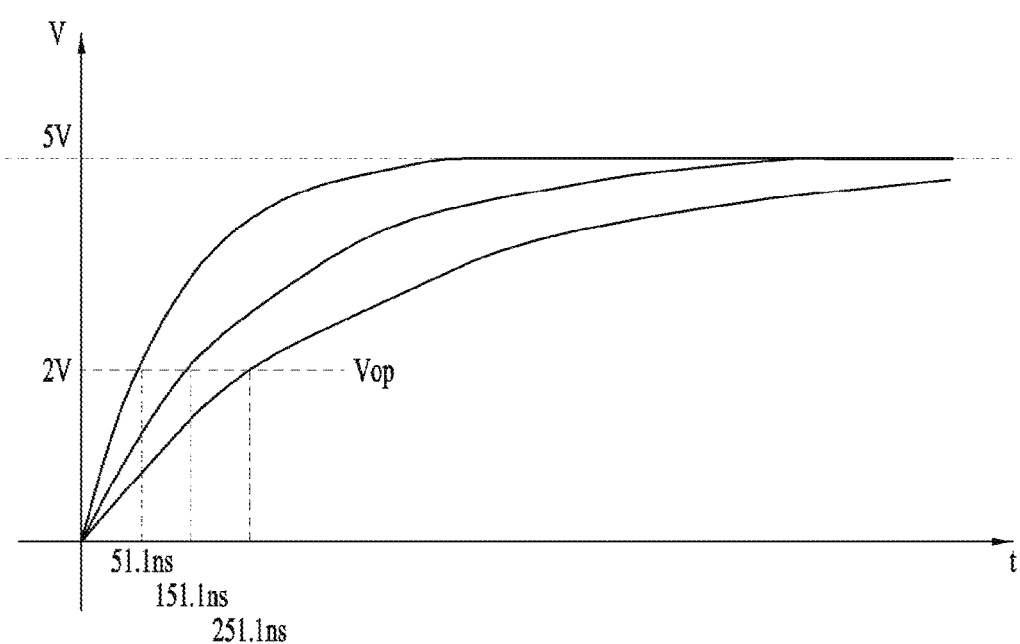
FIG. 7 is a waveform chart illustrating a process of designing a time constant of a noise reducer of the present disclosure.

FIG. 6 is a waveform chart illustrating current and voltage waveforms of a switching element, and FIG. 7 is a waveform chart illustrating waveforms values used when designing a time constant of a noise reducer in one embodiment of the present disclosure. Referring to FIG. 6, in the case that an IGBT switching element is used, a time consumed to switch the switching element from an On time is about 160 to 180 ns. Accordingly, a delay time of a switching time of the switching element may be set to be shorter than 160 to 180 ns. For example, the delay time may be set to about 100 ns or so, such as to set the delay time to range between 80 to 120 ns. While the delay time of the switching time may be changed according to design concept, the delay time may be shorter than the switching time.

In FIG. 6, a description will now be given focusing on a collector current Ic. In FIG. 6, tr denotes a time consumed to raise current from 10% to 90%, and trr denotes a time consumed to stabilize current from 90% to 100%. It can be appreciated that noise occurs during the time trr. In addition, td(on) denotes a time consumed to raise current up to 10% after a PWM high signal is applied, and ton denotes a time consumed to raise current up to 90% after the PWM high signal is applied.

Similarly, tf denotes a time taken when the current is lowered from 90% to 10%. In addition, td(off) denotes a time taken to lower current to 90% after a PWM low signal is applied, and toff denotes a time taken to lower the current to 10% after the PWM low signal is applied.

A process of configuring the noise reducer 160 by constructing an RC filter circuit in which a delay time of an On time of a switching element is set to 100 ns will now be described with reference to examples of waveforms shown in FIG. 7. As used herein, the delay time may correspond to at least one of the delay times a and b of FIG. 5. First, an RC filter is selected as a reference value according to a recommended value of a data sheet of a used inverter module. For example, a resistor of 100 Ω and a capacitor of 1 nF may be selected. Next, a rising time up to an operating voltage of 2 V of a gate driver of the inverter module may be calculated. The rising time may be calculated as 51.1 ns by Equation 1.

$$V = E\left(1 - e^{-\frac{t}{RC}}\right)$$ [Equation 1]

In Equation 1, E denotes a voltage value of a normal state, and RC denotes an RC time constant.

A total time of 151.1 ns (e.g., for phase V) may be obtained by adding the 51.1 ns rising time calculated above to a delay time of 100 ns. Next, a resistance satisfying a condition in which the rising time up to the operation voltage of 2 V becomes 151.1 ns may be calculated. For example, the resistance may be calculated as 300 Ω. That is, an RC filter to which the delay time is applied may select a resistor of 300 Ω and a capacitor of 1 nF. In a similar way, a resistance satisfying a condition in which a rising time up to the operation voltage of 2 V becomes 251.1 ns (e.g., for phase W) may be calculated, and then an RC filter to which the calculated resistance value is applied may be selected. Through the above process, the noise reducer 160 capable of being implemented using an RC filter considering a relay time may be configured.

Figure 8:
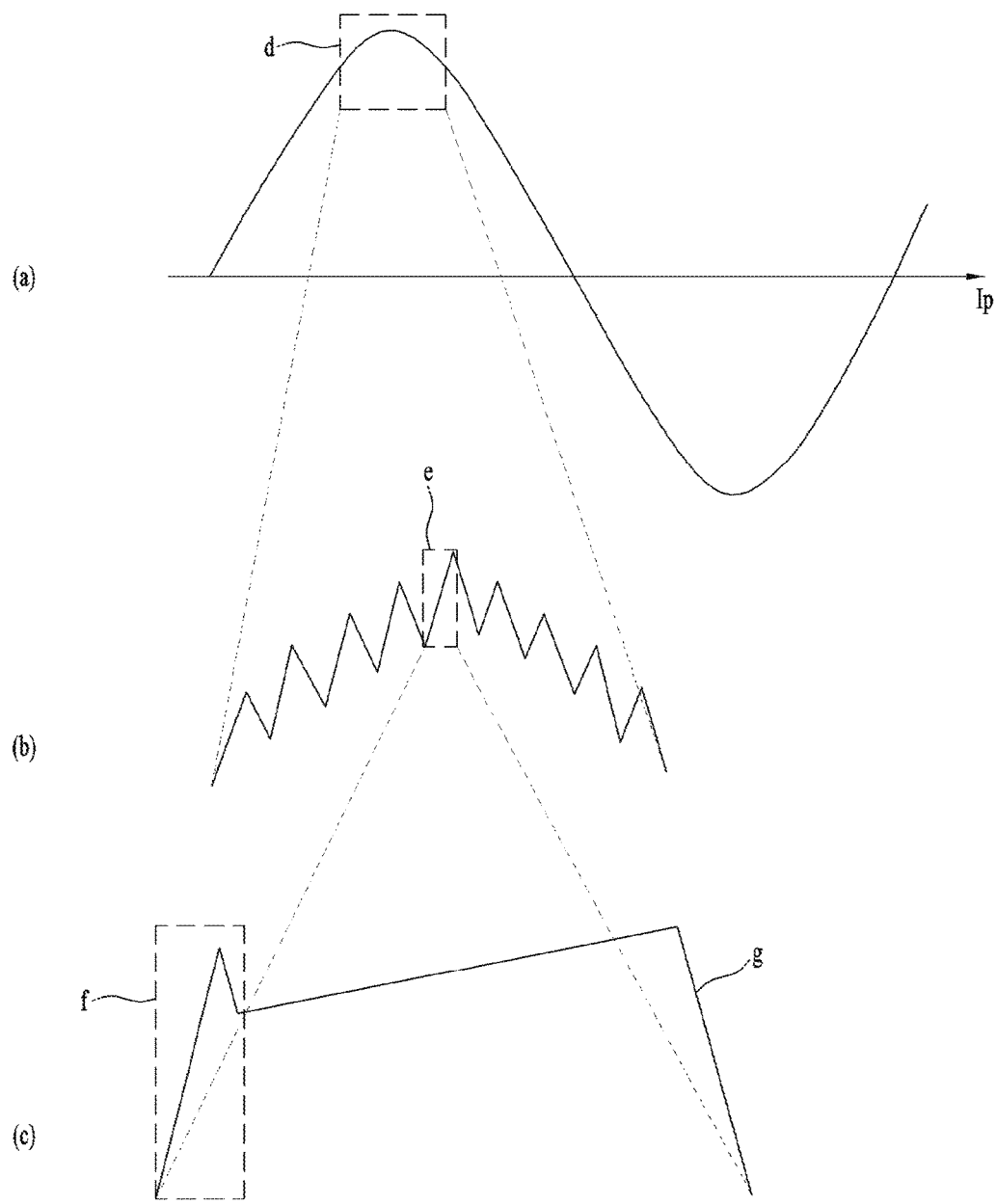
FIG. 8 is a waveform chart illustrating a phase current caused by an inverter and an enlarged view thereof.

FIG. 8 is a waveform chart illustrating a phase current Ip caused by an inverter and an enlarged view thereof. Region (a) of FIG. 8 illustrates the phase current Ip caused by an inverter, and region (b) of FIG. 8 is an enlarged view of a part d in region (a) of FIG. 8. As illustrated in region (b) of FIG. 8, the phase current Ip may include substantial noise, as shown by the peaks and valleys in the phase current Ip. Region (c) of FIG. 8 shows an enlarged view of a part e in region (b) of FIG. 8. Referring to region (c) of FIG. 8, one noise peak includes a part f caused by switching noise and a part g in which a slope is changed by inductance of a motor.

Figure 9:
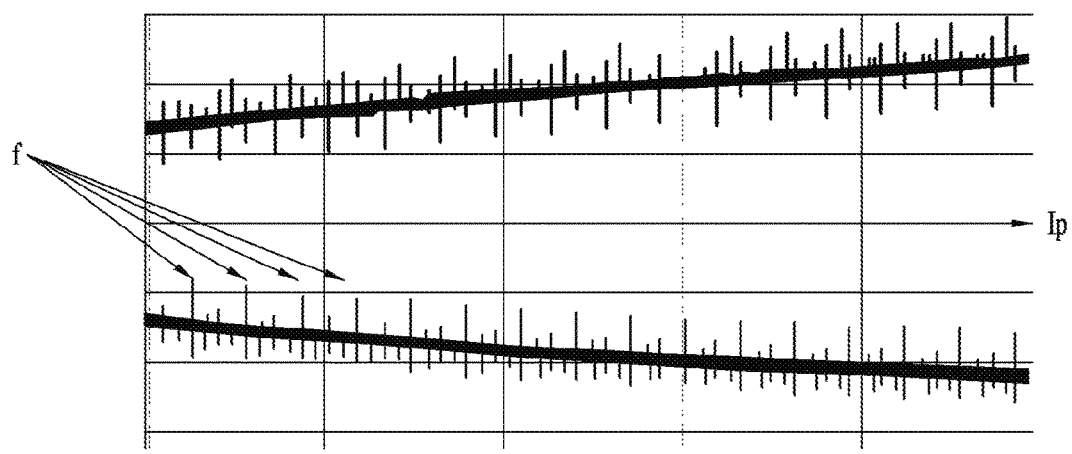
FIG. 9 is a waveform chart illustrating actual switching noise of a phase current.

FIG. 9 is a waveform chart illustrating actual switching noise of a phase current Ip. It can be appreciated that many switching noise components associated with the parts f may appear periodically. According to an embodiment of the present disclosure, since the magnitude of the parts f caused by switching noise can be significantly improved, entire switching noise can be reduced and thus an EMI characteristic can be improved. In addition, since overlapping of noise components is avoided, a peak does not appear in noise, and the EMI characteristic can be improved.

Accordingly, the present disclosure is directed to a power conversion apparatus and an air conditioner including the same. An aspect of the present disclosure provides a power conversion apparatus capable of improving an EMI noise characteristic by delaying an on/off time of a switching element of each phase and thus avoiding overlapping of initially damped noise, and an air conditioner including the same.

To achieve this and other aspects of the disclosure, a power conversion apparatus includes an inverter including a plurality of switching elements corresponding to three phases, a gate driver configured to drive the switching elements of the inverter, and a noise reducer connected to the gate driver and configured to set switching noise occurrence times caused by the switching elements in the respective phases to be different.

The noise reducer may include resistor-capacitor (RC) filters connected to the respective phases and at least two of the RC filters may have different time constant values. The time constant values may be sequentially changed. The time constant values may be sequentially increased from a reference value.

The power conversion apparatus may further include a controller configured to transmit a control signal to the gate driver and the noise reducer may be connected between the gate driver and the controller. The noise reducer may include a filter circuit configured to reduce noise of the control signal transmitted to the gate driver.

The noise reducer may set On times of the switching elements to be different. The noise reducer may set the switching noise occurrence times to be sequentially delayed in the respective phases. The delayed times may be shorter than switching times of the switching elements.

In another aspect of the present disclosure, a power conversion apparatus includes an inverter including a plurality of switching elements corresponding to three phases, a gate driver configured to driving the switching elements of the inverter, and a noise reducer connected to the gate driver and configured include resistor-capacitor (RC) filters connected to the respective phases, wherein at least two of the RC filters have different time constant values.

The time constant values may be sequentially increased from a reference value. The noise reducer may set On times of the switching elements to be sequentially delayed in the respective phases. The delayed times may be shorter than switching times of the switching elements.

The power conversion apparatus may further include a controller configured to transmit a control signal to the gate driver and the noise reducer may be connected between the gate driver and the controller.

The noise reducer may set switching noise occurrence times caused by the switching elements in the respective phases to be different. The noise reducer may set the switching noise occurrence times to be sequentially delayed in the respective phases.

In still another aspect of the present disclosure, an air conditioner includes a three-phase alternating current (AC) motor and a power conversion apparatus configured to drive the three-phase AC motor, wherein the AC conversion apparatus includes an inverter including a plurality of switching elements corresponding to three phases and a noise reducer configured to set switching noise occurrence times caused by the switching elements in the respective phases to be different.

The noise reducer may include resistor-capacitor (RC) filters connected to the respective phases and at least two of the RC filters may have different time constant values. The noise reducer may set the switching noise occurrence times to be delayed in the respective phases. The delayed times may be shorter than switching times of the switching elements.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A power conversion apparatus, comprising:
    an inverter including a plurality of switching elements corresponding to three phases of a three-phase motor including a first phase, a second phase, and a third phase;
    a gate driver configured to drive the switching elements of the inverter; and
    a noise reducer connected to the gate driver and configured to set switching noise occurrence times caused by the switching elements in respective ones of the three phases to be different,
    wherein switching of the switching element on the first phase is performed based on a reference switching time, switching of the switching element on the second phase is delayed after the reference switching time by a predetermined delay time a, and switching of the switching element on the third phase is delayed after the reference switching time by a predetermined delay time b that differs from the delay time a, and
    wherein the noise reducer includes resistor-capacitor (RC) filters connected to the respective three phases, and the RC filters for the respective three phases have different time constant values.

2. The power conversion apparatus according to claim 1, wherein the time constant values for the respective three phases are sequentially changed in the RC filters.

3. The power conversion apparatus according to claim 2, wherein the time constant values in the RC filters are increased from a reference value as the time constant values are sequentially changed.

4. The power conversion apparatus according to claim 1, further comprising a controller configured to transmit a control signal to the gate driver, wherein the noise reducer is provided between the gate driver and the controller.

5. The power conversion apparatus according to claim 4, wherein the noise reducer includes a filter circuit configured to reduce noise of the control signal transmitted to the gate driver.

6. The power conversion apparatus according to claim 1, wherein the noise reducer sets On times of the switching elements to be different.

7. The power conversion apparatus according to claim 1, wherein the noise reducer sets the switching noise occurrence times to be sequentially delayed in the three phases.

8. The power conversion apparatus according to claim 7, wherein delays in the switching noise occurrence times are shorter than switching times of the switching elements.

9. A power conversion apparatus, comprising:
    an inverter including a plurality of switching elements corresponding to three phases of a three phase motor including a first phase, a second phase, and a third phase;
    a gate driver configured to driving the switching elements of the inverter; and
    a noise reducer connected to the gate driver and including resistor-capacitor (RC) filters connected to the respective three phases, wherein the RC filters for the respective three phases have different time constant values,
    wherein the time constant values of the RC filters for the three phases are sequentially changed from a reference value, corresponding to a time constant value for the first phase.

10. The power conversion apparatus according to claim 9, wherein the time constant values are sequentially increased from the reference value with a fixed value for the three phases.

11. The power conversion apparatus according to claim 9, wherein the noise reducer sets On times of the switching elements to be sequentially delayed in the three phases.

12. The power conversion apparatus according to claim 11, wherein delays of the On times are shorter than switching times of the switching elements.

13. The power conversion apparatus according to claim 9, further comprising a controller configured to transmit a control signal to the gate driver, wherein the noise reducer is provided between the gate driver and the controller.

14. The power conversion apparatus according to claim 9, wherein the noise reducer sets switching noise occurrence times caused by the switching elements in the three phases to be different.

15. The power conversion apparatus according to claim 14, wherein the noise reducer sets the switching noise occurrence times to be sequentially delayed in the three phases.

16. An air conditioner, comprising: a three-phase alternating current (AC) motor; and a power converter configured to drive the three-phase AC motor, wherein the power converter includes:
  an inverter including a plurality of switching elements corresponding to three phases of the three-phase AC motor including a first phase, a second phase, and a third phase, and
  a noise reducer configured to set switching noise occurrence times caused by the switching elements in respective ones of the three phases to be different,
  wherein switching of the switching element on the first phase is performed based on a reference switching time, switching of the switching element on the second phase is delayed after the reference switching time by a predetermined delay time a, and switching of the switching element on the third phase is delayed after the reference switching time by a predetermined delay time b that differs from the delay time a, and
  wherein the noise reducer includes resistor-capacitor (RC) filters connected to the respective three phases, and the RC filters for the respective three phases have different time constant values.

17. The air conditioner according to claim 16, wherein delays in the switching noise occurrence times are shorter than switching times of the switching elements.

18. The air conditioner according to claim 16, wherein delay time a on the second phase and the delay time b on the third phase are equal.

19. The air conditioner according to claim 16, wherein the switching elements includes respective upper switching elements of the respective three phases and lower switching elements of the respective three phases, and
  wherein the RC filters connected to the upper switching elements of the respective three phases and the RC filters connected to the lower switching elements of the respective three phases have respective common values.

20. The air conditioner according to claim 16, wherein the gate driver includes a first driver that drives the switching element of a first phase upper arm, a second driver that drives the switching element of a second phase upper arm, a third driver that drives the switching element of a third phase upper arm, and a fourth driver that drives the switching elements of first, second, and third phase lower arms.

* * * * *